United States Patent
Fujita

(10) Patent No.: US 6,698,944 B2
(45) Date of Patent: Mar. 2, 2004

(54) EXPOSURE APPARATUS, SUBSTRATE PROCESSING UNIT AND LITHOGRAPHIC SYSTEM, AND DEVICE MANUFACTURING METHOD

(75) Inventor: Hiroyasu Fujita, Setagaya-ku (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/443,758

(22) Filed: May 23, 2003

(65) Prior Publication Data

US 2003/0231289 A1 Dec. 18, 2003

Related U.S. Application Data

(63) Continuation of application No. 09/880,067, filed on Jun. 14, 2001, now abandoned.

(30) Foreign Application Priority Data

Jun. 15, 2000 (JP) ........................................ 2000-179407
May 17, 2001 (JP) ........................................ 2001-148056

(51) Int. Cl.$^7$ ................................................ G03D 5/00
(52) U.S. Cl. ...................... 396/611; 700/108; 700/121; 700/218; 156/345.32; 29/25.01
(58) Field of Search ................................ 396/604, 611; 427/240; 156/345.32; 700/108, 121, 218; 414/935–941, 222; 29/25.01

(56) References Cited

U.S. PATENT DOCUMENTS

| | | | |
|---|---|---|---|
| 5,024,570 A | 6/1991 | Kiriseko et al. ............ | 414/222 |
| 5,105,362 A | 4/1992 | Kotani et al. ............... | 700/108 |
| 5,788,868 A | 8/1998 | Itaba et al. ............ | 156/345.22 |
| 5,928,389 A | 7/1999 | Jevtic ........................ | 29/25.01 |
| 6,122,566 A | 9/2000 | Nguyen et al. ............. | 700/218 |
| 6,282,457 B1 | 8/2001 | Miura et al. ................ | 700/121 |

FOREIGN PATENT DOCUMENTS

| | | |
|---|---|---|
| JP | 09-326339 | 12/1997 |
| JP | 10-012702 | 1/1998 |
| JP | 11-176911 | 7/1999 |

*Primary Examiner*—Della J Rutledge
(74) *Attorney, Agent, or Firm*—Oblon, Spivak, McClelland, Maier & Neustadt, P.C.

(57) ABSTRACT

The exposure apparatus and the substrate processing unit is connected via an in-line I/F portion. In addition, information on the substrate carriage is communicated in between the control unit of the exposure apparatus side and the control unit of the substrate processing unit, and both units decide their next operation that contribute to improving the processing capacity related to the wafer carriage, before actually starting the operation. Therefore, the throughput of the series of wafer processing performed by the substrate processing unit and the exposure apparatus can be improved, and as a consequence, becomes possible to improve the productivity of the device. In this case, for example, information on the predicted time or the expected time when the substrate can be received or sent out is reciprocally communicated between both units.

23 Claims, 7 Drawing Sheets

EXPOSURE APPARATUS, SUBSTRATE PROCESSING UNIT AND LITHOGRAPHIC SYSTEM, AND DEVICE MANUFACTURING METHOD

BACKGROUND OF THE INVENTION

1. Field of the Invention

The present invention relates to an exposure apparatus, a substrate processing unit and a lithographic system, and a device manufacturing method. More particularly, the present invention relates to an exposure apparatus used in a lithographic process when producing a semiconductor element, a liquid crystal display, a plasma display, a thin film magnetic head, an image pick-up device (CCD), a microdevice such as a micromachine, and furthermore, a photomask (reticle) and the like, a substrate processing unit which is in-line connected to the exposure apparatus, and a lithographic system which arrangement includes the exposure apparatus and the substrate processing unit, and a device manufacturing method employing the exposure apparatus and the lithographic system.

2. Description of the Related Art

In the lithographic process to produce a microdevice such as a semiconductor element and the like referred to above, various exposure apparatus were used in general. In recent years, the exposure apparatus that transfers a pattern formed on a mask or a reticle (hereinafter generally referred to as a "reticle") onto a substrate such as a wafer or a glass plate (hereinafter generally referred to as a "wafer") coated with a photoresist (photosensitive agent) via a projection optical system is mainly used. Of the exposure apparatus, the reduction projection exposure apparatus (the so-called stepper) based on the step-and-repeat method was the mainstream. However, the usage of the scanning type exposure apparatus (the so-called scanning stepper) based on the step-and-scan method, which performs exposure by synchronously scanning the reticle and the wafer in respect to the projection optical system, has lately increased.

The lithographic process includes a resist coating process to coat the resist onto the surface of the wafer and a development process to develop the wafer after completing the reticle pattern transfer, performed before and after the exposure process that uses the exposure apparatus. And in the resist coating process and the development process, a coating/development unit called a coater developer (hereinafter abbreviated as "C/D") is used. This coater developer has the function of both a resist coating unit (a coater) such as a spin coater which, for example, spins the wafer at a high speed and utilizes the rotation of the wafer to evenly coat drops of resist dripped onto the surface of the wafer, or a scan coater which relatively moves the nozzle and the wafer, and a development unit (a developer).

In the lithographic process, a system arrangement, which is widely called as an in-line connection, is frequently employed. With the in-line connection, the C/D is arranged, for example, on the left, right, or the front (or the back) of the exposure apparatus and is connected directly or via a connecting portion to the exposure apparatus, and the body subject to processing (wafer subject to processing) is carried automatically in between the C/D and the exposure apparatus. The purpose for employing this system arrangement is to avoid complication when delivering the processing lot (the wafer lot subject to processing) to each of the resist coating process, the exposure process, and the development process, and to also improve the throughput while maintaining the chemical properties in the chemically amplified resist, which is a type of resist with high sensitivity frequently used nowadays.

In the lithographic system employing such an in-line connection between the exposure apparatus and the C/D, in most cases, a delivery portion is arranged in between the exposure apparatus and the C/D to perform delivery of the wafer between these units. In addition, the C/D has a carriage system within the unit that circulates the wafer subject to processing under a fixed process between the coating portion where the coating process is performed and the development portion where the development process is performed. The exposure apparatus also has a carriage system within the unit, and circulates the wafer subject to processing between the wafer stage where the exposure is performed and the delivery portion.

Moreover, with the lithographic process described above, in many cases, a cooling portion and a bake portion are arranged when necessary. Furthermore, a buffer portion to temporarily house the wafer subject to processing is also arranged when necessary.

In the lithographic system employing the in-line connection of the exposure apparatus and the C/D, when delivery of the wafer is performed at the delivery portion, the exposure apparatus and the C/D communicate with each other so that the delivery of the wafer is performed without fail. Therefore, the exposure apparatus and the C/D respectively have a control portion that performs communication and carriage control.

In the conventional lithographic system, however, the exposure apparatus and the C/D communicated on issues related to the delivery of the wafer at the delivery portion such as the delivery request, the possibility/forbiddance of delivery, and the completion of delivery and the like only real time, step by step.

This caused circumstances such as the exposure apparatus not being able to receive the wafer, when the C/D circulates the wafer under the fixed procedure so as to perform optimal carriage within the unit and tries to deliver the wafer that has not yet been exposed during the carriage to the exposure apparatus through the delivery portion. Or, the C/D could not receive the wafer that has completed exposure at the exposure apparatus side through the delivery portion, because the wafer had not yet arrived at the delivery portion. This situation led to a longer waiting time, and in some cases, the delivery ended in failure since no wafers were ready for delivery due to the difference in timing of the circulation carriage within the respective units, and the wafer carriage was suspended until the next circulation timing.

Whereas, with the exposure apparatus, the operation is efficient when the wafer is processed continuously on the wafer stage. Therefore, in order to avoid the situation where there are no wafers to process on the wafer stage as much as possible, the loading of the wafer onto the wafer stage and the unloading of the wafer from the wafer stage need to be performed alternately or simultaneously. With the wafers that have been exposed, the wafers need to be unloaded without the time spent on each wafer differing and sent to the next process of bake/development performed by the C/D as quickly as possible, since the chemical change of the wafer is continuous.

Considering such circumstances, the exposure apparatus side performs wafer carriage in the order of loading the wafer into the apparatus and then unloading the wafer outside the apparatus. There were times, however, when the exposure apparatus tried to receive the wafer that has not yet been exposed from the delivery portion but could not since the C/D side had not yet delivered the wafer, or, when the exposure apparatus tried to deliver the wafer that has completed exposure to the C/D through the delivery portion but could not since the C/D side was not in a state to receive the wafer. In these cases, the exposure apparatus waits for a certain period and monitors the situation to see if the wafer that has not yet gone through the exposure process is delivered. And if the wafer is not delivered and exposure process is completed at that stage, the exposure apparatus suspends the wafer loading, and switches the circulation operation to the unloading operation of the wafer that has completed the exposure process. Therefore, the situation occurred at times where the delivery ended in failure or where the exposure apparatus had to wait for delivery at the delivery portion.

The description above describes the case when the carriage system of the exposure apparatus performs the loading and unloading of the wafer alternately, however, even if the carriage system performs the loading simultaneously, the restrictions at the delivery portion inevitably cause the exposure apparatus to wait for the delivery of the wafer.

That is, the C/D unit and the exposure apparatus were capable of respectively completing their predetermined procedures and operating in optimal on their own. However, when the C/D unit and the exposure apparatus were linked to each other with the delivery portion as the center, the circulation operation of the wafer carriage on the C/D side did not correspond with the circulation operation of the wafer carriage on the exposure apparatus side. This situation often caused a waste of time in waiting for the wafer and also caused the delivery to end in failure, which led to a decrease in throughput.

Nevertheless, the decrease in throughput due to the waiting time and the failure in delivery was not a serious problem, since conventionally, the size of the wafer used was mainly 8 inches (approximately 200 mm) and under in diameter and the wafer control was performed per lot.

The wafer, however, is becoming larger in size with higher integration of the semiconductor element, and in future, it is said that the wafer having the diameter of 12 inches (approximately 300 mm) will become mainstream and the wafer control per wafer will become mandatory. With the practice performing such wafer control, it is certain that the decrease in throughput due to the waiting time and the failure in delivery referred to above will be a more serious problem, compared with the conventional practice.

SUMMARY OF THE INVENTION

The present invention has been made in consideration of the circumstances described above, and has as its first object to provide an exposure apparatus that is in-line connected with a substrate processing unit and is capable of improving the throughput in a series of substrate processing.

It is the second object of the present invention to provide a substrate processing unit that is in-line connected with an exposure apparatus and is capable of improving the throughput in a series of substrate processing.

And, it is the third object of the present invention to provide a lithographic system and a device manufacturing method that can improve the productivity of a device by improving the throughput in a series of substrate processing.

According to the first aspect of this invention, there is provided an exposure apparatus which is in-line connected with a substrate processing unit, the exposure apparatus comprising: a substrate carriage system which carries a substrate and delivers a substrate between the substrate processing unit via a delivery portion; and a control unit which structures a control system to control the substrate carriage system, the control unit performing at least one of transmitting and receiving specific information between the substrate processing unit in advance to decide an operation that contributes to improvement in processing capacity related to substrate carriage.

In this description, the term "information" is used in a broad sense, and includes the concept of signals other than data or a group of data.

According to the exposure apparatus, the control unit at least transmits or receives in advance specific information between the substrate processing unit, to decide its operation that contributes to improvement in processing capacity related to substrate carriage. For example, in the case the control unit transmits the specific information to the substrate processing unit in advance, it can make the substrate processing unit decide its operation that contributes to improvement in processing capacity related to substrate carriage before the operation actually begins. On the other hand, when the control unit receives the specific information from the substrate processing unit in advance, it can decide its operation that contributes to improvement in processing capacity related to substrate carriage before the operation actually begins.

Accordingly, in either case, the processing capacity in the series of substrate processing performed by the substrate processing unit and the exposure apparatus, in other words, the throughput can be improved. Especially, when the control unit receives the specific information from the substrate processing unit in advance, as well as transmits the specific information to the substrate processing unit in advance, it can decide its own operation that contributes to improvement in processing capacity related to substrate carriage before the operation actually begins, in addition to making the substrate processing unit decide its operation that contributes to improvement in processing capacity related to substrate carriage before the operation actually begins. Therefore, it becomes possible to improve the throughput in the series of substrate processing performed by the substrate processing unit and the exposure apparatus to the utmost.

In this case, the control unit can transmit information to the substrate processing unit so that the substrate processing unit can decide its following operation that contributes to improvement in processing capacity related to substrate carriage, the information transmitted prior to starting the following operation as the specific information. In such a case, the control unit transmits information to make the substrate processing unit decide its following operation that contributes to improvement in processing capacity related to substrate carriage to the in-line connected substrate processing unit, prior to the start of the following operation. So, when the substrate processing unit receives the information, it can decide to perform the specific operation that contributes to improvement in processing capacity related to substrate carriage as its following operation beforehand, that is, decide to perform the specific operation before actually starting the specific operation. Accordingly, it becomes possible to improve the throughput in the series of substrate processing performed by the substrate processing unit and the exposure apparatus.

In this case, the information can include one of a predicted time and an expected time until the substrate carriage system is capable of receiving a substrate. In such a case, since the substrate processing unit side can acknowledge the timing when the substrate carriage system of the exposure apparatus side can receive the substrate, it can decide its next operation related to substrate carriage so that the substrate can be delivered with the least time wasted. For example, when the time until the substrate carriage system of the exposure apparatus side can receive the substrate is short, such as one or two seconds, then, the substrate processing system can wait to deliver the substrate, whereas, if the waiting time is long, then it can suspend delivering the substrate and just receive the substrate from the delivery portion. Then, the loss of time can be reduced.

Or, the information can include information so as to make the substrate processing unit side withhold carriage of a substrate to the delivery portion. In such a case, for example, the control unit sends information to the substrate processing unit such as to wait for a predetermined seconds to carry the substrate to the delivery portion until the substrate can be received. In this case, also, the substrate processing unit can decide its operation related to efficient carriage of the substrate so as to reduce the loss of time as much as possible, depending on the waiting time.

Or, the information can include one of a predicted time and an expected time until the substrate carriage system is capable of sending out a substrate. In such a case, for example, if the substrate that has been exposed is to be delivered from the exposure apparatus side within a few seconds, the substrate processing unit which receives the information can wait for a few seconds upon receiving the substrate. Thus, the delivery does not have to end in failure, and can be efficiently performed.

Or, the information can include information so as to make the substrate processing unit side withhold operations to receive a substrate at the delivery portion. In such a case, for example, the control unit sends information to the substrate processing unit such as to wait for a predetermined seconds so that the substrate can be delivered. In this case, as well, the substrate processing unit can decide its operation related to efficient carriage of the substrate so as to reduce the loss of time as much as possible, depending on the waiting time.

With the exposure apparatus according to the present invention, in the case the control unit transmits information to the substrate processing unit so that the substrate processing unit can decide its following operation that contributes to improvement in processing capacity related to substrate carriage, prior to starting the following operation as the specific information, the control unit can further receive information related to substrate carriage from the substrate processing unit as the specific information, and based on the information, can determine in advance its following operation that contributes to improvement in processing capacity related to substrate carriage. In such a case, the control unit receives information related to substrate carriage from the substrate processing unit, and based on the information, decides in advance its following operation that contributes to improvement in processing capacity related to wafer carriage. Therefore, in addition to the efficiency related to the substrate carriage on the substrate processing unit side, the efficiency related to the substrate carriage on the exposure unit side is also improved. Accordingly, it becomes possible to further improve the throughput in the series of substrate processing performed by the substrate processing unit and the exposure apparatus.

With the exposure apparatus according to the present invention, the control unit can receive information related to substrate carriage from the substrate processing unit as the specific information, and based on the information, can determine in advance its following operation that contributes to improvement in processing capacity related to substrate carriage. In such a case, the control unit receives information related to substrate carriage from the substrate processing unit, and based on the information, determines in advance its following operation that contributes to improvement in processing capacity related to substrate carriage. Therefore, the processing capacity in the series of substrate processing operation performed by the substrate processing unit and the exposure apparatus, that is, the throughput, can be improved.

In this case, the information can include one of a predicted time and an expected time until the substrate processing unit side is capable of sending out a substrate. In such a case, the control unit can acknowledge the timing when the substrate processing unit side can deliver the substrate; therefore, it can decide its next operation related to substrate carriage so that the substrate can be received with the least time wasted. For example, when the time until the substrate processing unit side can deliver the substrate is short, such as one or two seconds, then, the control unit can wait to receive the substrate, whereas, if the waiting time is long, then it can suspend receiving the substrate and just deliver the substrate. Then, the loss of time can be reduced. That is, fruitless operation such as waiting for a certain period of time to receive the substrate can be avoided.

Or, the information can include information so as to make the substrate carriage system withhold operations to receive a substrate at the delivery portion. In such a case, for example, the substrate processing unit sends information to the control unit such as to wait for a predetermined seconds until the substrate can be delivered. In this case, as well, the control unit can decide its operation related to the most efficient carriage of the substrate possible, according to the waiting time.

Or, the information can include one of a predicted time and an expected time until the substrate processing unit side is capable of receiving a substrate. In such a case, for example, if the substrate that has been exposed can be received by the substrate processing unit side within a few seconds, the control unit, which receives the information, can wait for a few seconds to deliver the substrate. And if a long wait is required until the substrate can be received, then it becomes possible to perform other operations first, such as receiving operations, and then deliver the substrate to the substrate processing unit. Thus, the delivery does not have to end in failure, and the efficiency is improved.

Or, the information can include information so as to make the substrate carriage system withhold operations to send out a substrate to the delivery portion. In such a case, for example, the substrate processing unit sends information to the control unit such as to wait for a predetermined seconds until the substrate can be received. In this case, as well, the control unit can decide its operation related to the most efficient carriage of the substrate possible, in accordance with the waiting time.

According to the second aspect of this invention, there is provided a substrate processing unit which is in-line connected with an exposure apparatus, the substrate processing unit comprising: a substrate carriage system which carries a substrate and delivers a substrate between the exposure apparatus unit via a delivery portion; and a control unit which structures a control system to control the substrate carriage system, the control unit performing at least one of transmitting and receiving specific information between the exposure apparatus in advance to decide an operation that contributes to improvement in processing capacity related to substrate carriage.

With the substrate processing unit, the control unit at least transmits or receives in advance specific information between the exposure apparatus, to decide its operation that contributes to improvement in processing capacity related to substrate carriage. For example, in the case the control unit transmits the specific information to the exposure apparatus in advance, it can make the exposure apparatus decide its operation that contributes to improvement in processing capacity related to substrate carriage before the operation actually begins. On the other hand, when the control unit receives the specific information from the exposure apparatus in advance, it can decide its operation that contributes to improvement in processing capacity related to substrate carriage before the operation actually begins.

Accordingly, in either case, the processing capacity in the series of substrate processing performed by the substrate processing unit and the exposure apparatus, in other words, the throughput can be improved. Especially, when the control unit receives the specific information from the exposure apparatus in advance, as well as transmits the specific information to the exposure apparatus in advance, it can decide its own operation that contributes to improvement in processing capacity related to substrate carriage before the operation actually begins, in addition to making the exposure apparatus decide its operation that contributes to improvement in processing capacity related to substrate carriage before the operation actually begins. Therefore, it becomes possible to improve the throughput in the series of substrate processing performed by the substrate processing unit and the exposure apparatus to the utmost.

In this case, the control unit can transmit information to the exposure apparatus so that the exposure apparatus can decide its following operation that contributes to improvement in processing capacity related to substrate carriage, the information transmitted prior to starting the following operation as the specific information. In such a case, the control unit transmits information to make the exposure apparatus decide its following operation that contributes to improvement in processing capacity related to substrate carriage to the in-line connected exposure apparatus, prior to the start of the following operation. So, when the exposure apparatus receives the information, it can decide to perform the specific operation that contributes to improvement in processing capacity related to substrate carriage as its following operation beforehand, that is, decide to perform the specific operation before actually starting the specific operation. Accordingly, it becomes possible to improve the processing capacity in the series of substrate processing performed by the exposure apparatus and the substrate processing unit, that is, to improve the throughput.

In this case, the information may include one of a predicted time and an expected time until the substrate carriage system is capable of receiving a substrate, or the information may include information so as to make the exposure apparatus side withhold carriage of a substrate to the delivery portion, or the information may include one of a predicted time and an expected time until the substrate carriage system is capable of sending out a substrate, or the information may include information so as to make the exposure apparatus side withhold operations to receive a substrate at the delivery portion.

With the substrate processing unit according to the present invention, when the control unit transmits information to the exposure apparatus so that the exposure apparatus can decide its following operation that contributes to improvement in processing capacity related to substrate carriage, and the information is transmitted prior to starting the following operation as the specific information, the control unit can further receive information related to substrate carriage from the exposure apparatus as the specific information, and based on the information, can determine in advance its following operation that contributes to improvement in processing capacity related to substrate carriage. In such a case, the control unit receives information related to substrate carriage from the exposure apparatus, and based on the information, decides in advance its following operation that contributes to improvement in processing capacity related to wafer carriage. Therefore, in addition to the efficiency related to the substrate carriage on the exposure apparatus side, the efficiency related to the substrate carriage on the substrate processing unit side is also improved. Accordingly, it becomes possible to further improve the throughput in the series of substrate processing performed by the substrate processing unit and the exposure apparatus.

With the substrate processing unit according to the present invention, the control unit can receive information related to substrate carriage from the exposure apparatus as the specific information, and based on the information, can determine in advance its following operation that contributes to improvement in processing capacity related to substrate carriage. In such a case, the control unit receives information related to substrate carriage from the exposure apparatus, and based on the information, determines in advance its following operation that contributes to improvement in processing capacity related to substrate carriage. Therefore, the processing capacity in the series of substrate processing operation performed by the substrate processing unit and the exposure apparatus, that is, the throughput, can be improved.

In this case, the information may include one of a predicted time and an expected time until the exposure apparatus side is capable of sending out a substrate, or the information may include information so as to make the substrate carriage system withhold operations to receive a substrate at the delivery portion, or the information may include one of a predicted time and an expected time until the exposure apparatus side is capable of receiving a substrate, or the information may include information so as to make the substrate carriage system withhold operations to send out a substrate to the delivery portion.

According to the third aspect of this invention, there is provided a lithographic system, the system comprising: an exposure apparatus; and a substrate processing unit which is in-line connected to the exposure apparatus, the processing unit transmitting and receiving information related to carriage of a substrate between the exposure apparatus, wherein at least one of the exposure apparatus and the substrate processing unit decides its following operation that contributes to improvement in processing capacity related to substrate carriage based on the information, prior to starting the following operation.

With the lithographic system, information related to substrate carriage is transmitted and received between the exposure apparatus and the substrate processing unit, and by at least either of the unit, its following operation that contributes to improvement in processing capacity related to substrate carriage is decided prior to starting the operation based on the information. This allows the processing capacity in the series of substrate processing performed by the substrate processing unit and the exposure apparatus, in other words, the throughput to be improved, and as a consequence, becomes possible to improve the productivity of the device. Especially in the case when both units decide their following operation that contributes to improvement in processing capacity related to substrate carriage prior to starting the operation based on the information, the throughput can be improved to the utmost.

In this case, for example, information on the predicted time or the expected time until the substrate can be received or sent out can be reciprocally notified between both units.

With the lithographic system in the present invention, in the case the information transmitted and received between the exposure apparatus and the substrate processing unit includes withholding information to make a unit other than itself withhold carriage operations of a substrate, and the withholding information is concurrently sent by both the exposure apparatus and the substrate processing unit, a unit to which preference is given in advance can send information to the unit other than itself to dismiss its withholding request, and the unit other than itself can withdraw the withholding request in accordance with the dismissal request information. In such a case, likewise as above, the processing capacity in the series of substrate processing performed by the substrate processing unit and the exposure apparatus, in other words, the throughput can be improved.

With the lithographic system according to the present invention, the information may be communicated directly between the exposure apparatus and the substrate processing unit, or the lithographic system may further comprise a separate unit which acts as an intermediary when the information is transmitted and received between the exposure apparatus and the substrate processing unit.

With the lithographic system according to the present invention, in the case the lithographic system further comprises: a superior unit which has total control over the exposure apparatus and the substrate processing unit, the information transmitted and received between the exposure apparatus and the substrate processing unit can include withholding information to make a unit other than itself withhold carriage operations of a substrate, and when the withholding information is concurrently sent by both the exposure apparatus and the substrate processing unit, the superior unit may totally judge from the viewpoint of improving the processing capacity to send information to one of a predetermined unit to dismiss its withholding request to make the predetermined unit withdraw the withholding request.

According to the fourth aspect of this invention, there is provided a first device manufacturing method to manufacture a device using a lithographic system which comprises an exposure apparatus and a substrate processing unit in-line connected to the exposure apparatus, the device manufacturing method comprising: transmitting and receiving information related to carriage of a substrate between the exposure apparatus and the substrate processing unit; and at least one of the exposure apparatus and the substrate processing unit decides its following operation that contributes to improvement in processing capacity related to substrate carriage based on the information, prior to starting the following operation.

With this method, the processing capacity in the series of substrate processing performed by the substrate processing unit and the exposure apparatus, in other words, the throughput, can be improved, and as a consequence, it becomes possible to improve the productivity of the device. Especially, in the case when both units decide their following operation that contributes to improvement in processing capacity related to substrate carriage prior to starting the operation based on the information, the throughput can be improved to the utmost.

In addition, in the case the exposure apparatus according to the present invention is used in the lithographic process, since the exposure apparatus is used having in-line connection with the substrate processing unit, the throughput in the series of substrate processing performed by these units can be improved, and this consequently allows the productivity of the device manufactured to be improved. Accordingly, from another aspect of the present invention, there is provided a second device manufacturing method that uses the exposure apparatus of the present invention.

DESCRIPTION OF THE PREFERRED EMBODIMENTS

An embodiment of the present invention will be described below with reference to FIGS. 1 to 4.

Figure 1:
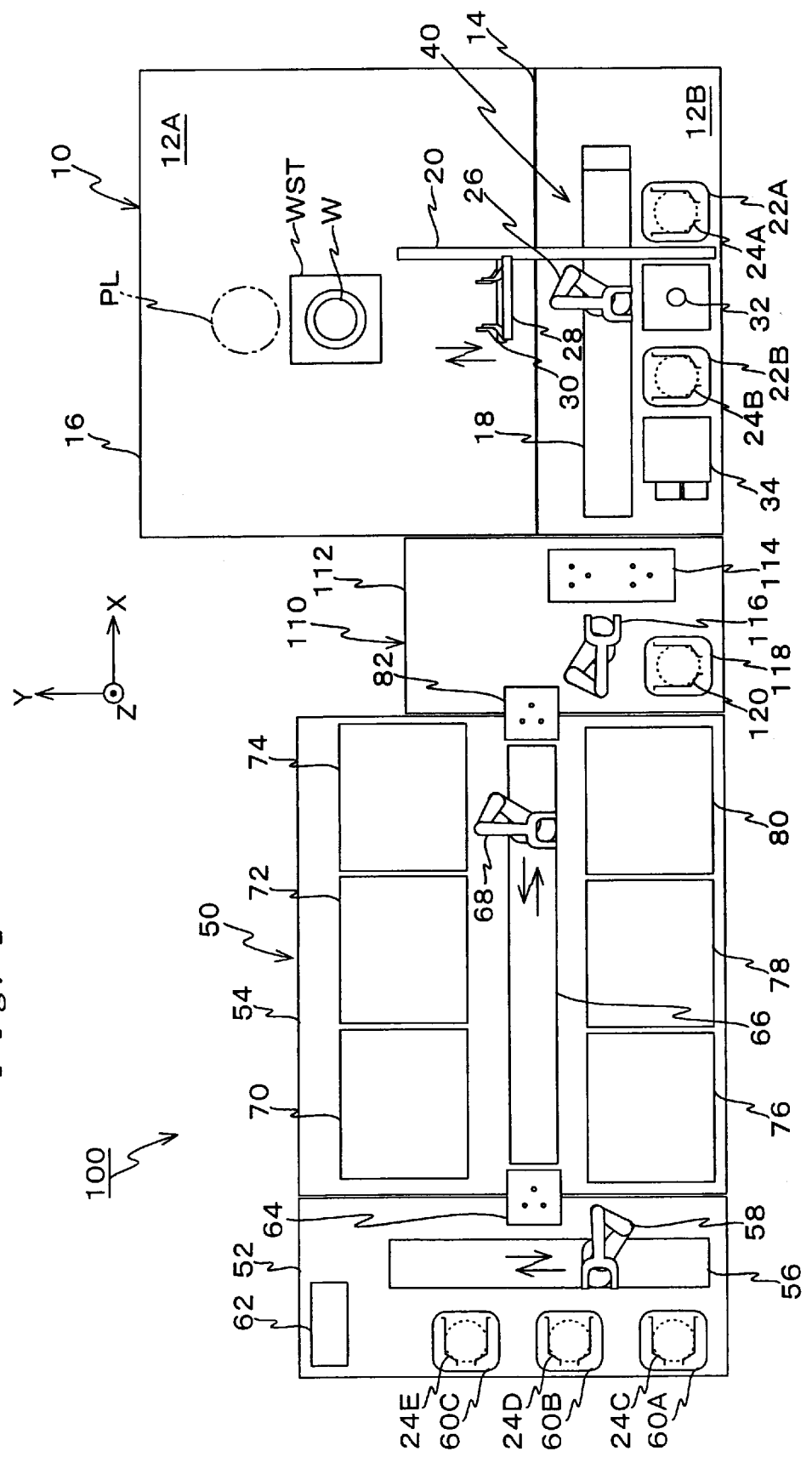
FIG. 1 is a schematic view showing the arrangement of the lithographic system of an embodiment related to the present invention.

FIG. 1 shows an arrangement of a lithographic system related to the embodiment, which includes the exposure apparatus and the substrate processing unit related to the present invention.

The lithographic system 100, shown in FIG. 1, comprises an exposure apparatus 10, a C/D 50 serving as a substrate processing unit, and an in-line interface portion (hereinafter referred to as the "in-line I/F portion") 110 which in-line connects the exposure apparatus 10 and the C/D 50. This lithographic system 100 is arranged in a clean room.

Hereinafter, for the sake of convenience, the landscape direction in FIG. 1 is described as the X-axis direction, the direction perpendicular to the X-axis direction (the portrait direction) in FIG. 1 is described as the Y-axis direction, and the direction perpendicular to the X-axis and Y-axis, in other words, perpendicular to the surface of the page, is described as the Z-axis direction.

As is shown in FIG. 1, the exposure apparatus 10 comprises a chamber 16 which interior is divided into an exposure chamber 12A and a loader chamber 12B by a partition wall 14. The partition wall 14 is arranged slightly below the center in the Y-axis direction, on the −Y side. Of these chambers, a large portion of the wafer loader system 40 serving as the substrate carriage system on the exposure apparatus side is housed within the loader chamber 12B, and the main body of the exposure apparatus (not shown in Figs., the parts other than the wafer stage WST and the projection optical system PL are omitted) which transfers the reticle pattern onto a wafer W serving as a substrate on the wafer stage WST is housed in the exposure chamber 12A.

The wafer loader system 40 comprises: an X guide 18 which extends in the X-axis direction; and a Y guide 20 which is located above the X guide 18 and extends in the Y-axis direction, serving as a carriage guide. The Y guide 20 is arranged so that it penetrates through the partition wall 14. In addition, on the −Y side of the X guide 18 in the loader chamber 12B, carrier mounts 22A and 22B are arranged at a predetermined interval along the X-axis direction, and open carriers (hereinafter abbreviated as "OC" as appropriate) 24A and 24B capable of housing a plurality of wafers are mounted on these carrier mounts 22A and 22B. The OCs 24A and 24B are delivered to/from the chamber 16 through an entrance (not shown in Figs) arranged on the side wall in the −Y side of the chamber 16 which has a door (also not shown in Figs) that can be opened/closed. The OCs 24A and 24B may be carried by a PGV (Personnel Guided Vehicle) and delivered manually by an operator, or may be carried by an AGV (Automated Guided Vehicle) and automatically delivered. The OHT (Over Head Transfer) may of course, be employed to respectively place the OCs 24A and 24B onto the carrier mounts 22A and 22B from above. In addition, the OCs 24A and 24B are used to deliver the wafer directly to the exposure apparatus 10, without the usage of the in-line operation with the C/D 50.

On the X guide 18, a horizontal jointed arm robot (a scalar robot) 26 that moves along the X guide 18 and is driven by a driving unit (not shown in Figs.) is arranged. Also, the Y guide 20 is provided with a wafer load arm 28 and a wafer unload arm 30 that move along the Y guide 20 and are driven by a driving unit (also not shown in Figs.).

Furthermore, on the −X side of the Y guide 20 in the −Y end, in between the carrier mounts 22A and 22B, a turntable (rotation table) 32 is arranged, and a wafer edge sensor (not shown in Figs.) is arranged at a predetermined interval in the Y direction apart from the turntable 32.

Although it is omitted in the drawings, the wafer stage WST moves two dimensionally in the XY direction on a supporting bed held by vibration isolation pads. And the wafer stage WST holds the wafer W onto which the reticle pattern is transferred.

Moreover, within the loader chamber 12B, a loader controller 34 is arranged. The loader controller 34 controls each portion of the wafer loader system as well as communicates information, in other words, communicates with the with the controller on the C/D side via a communication channel.

The in-line I/F portion 110 comprises: a chamber 112 arranged in the −X direction of the chamber 16 structuring the exposure apparatus 10; an in-line delivery portion 114 arranged on the +X side within the chamber 112; and a horizontal jointed arm robot 116 arranged on the −X side of the in-line delivery portion 114, and the like.

Figure 2:
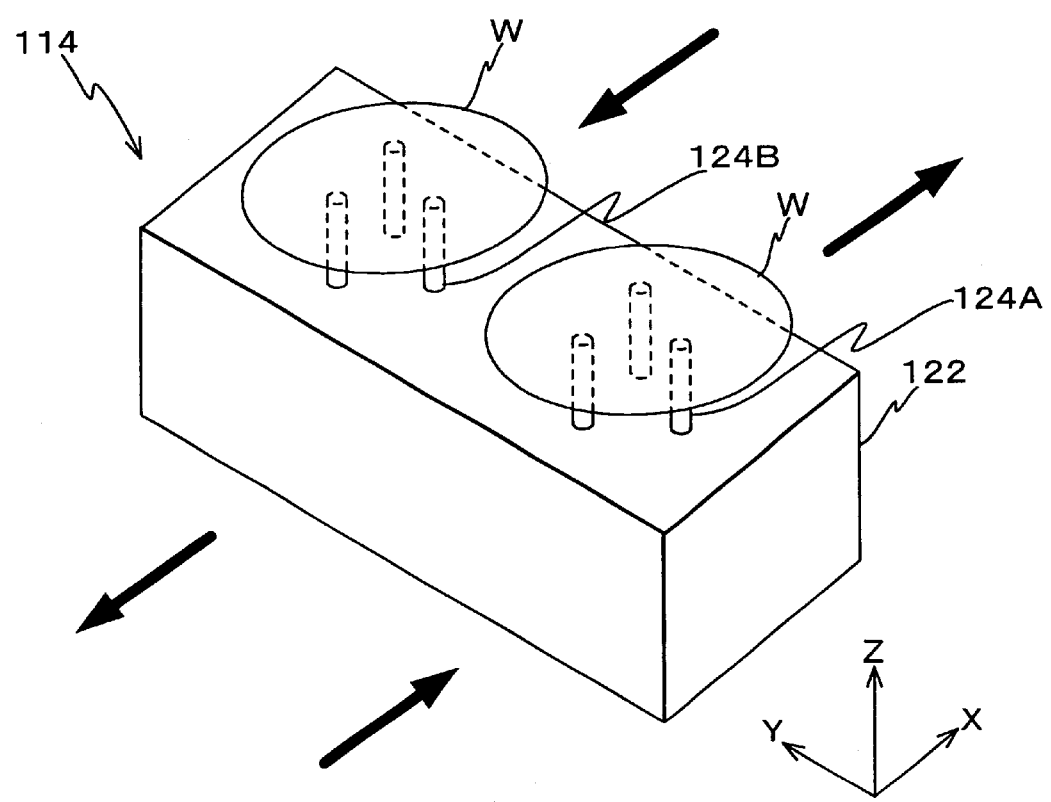
FIG. 2 is an enlarged diagonal view showing the in-line delivery portion in FIG. 1.

As is shown in FIG. 2, the in-line delivery portion 114 comprises: a base mount 122; and wafer delivery portions 124A and 124B arranged on the base mount 122 in the Y direction at a predetermined interval, which are each made up of a set of three supporting pins.

Figure 3:
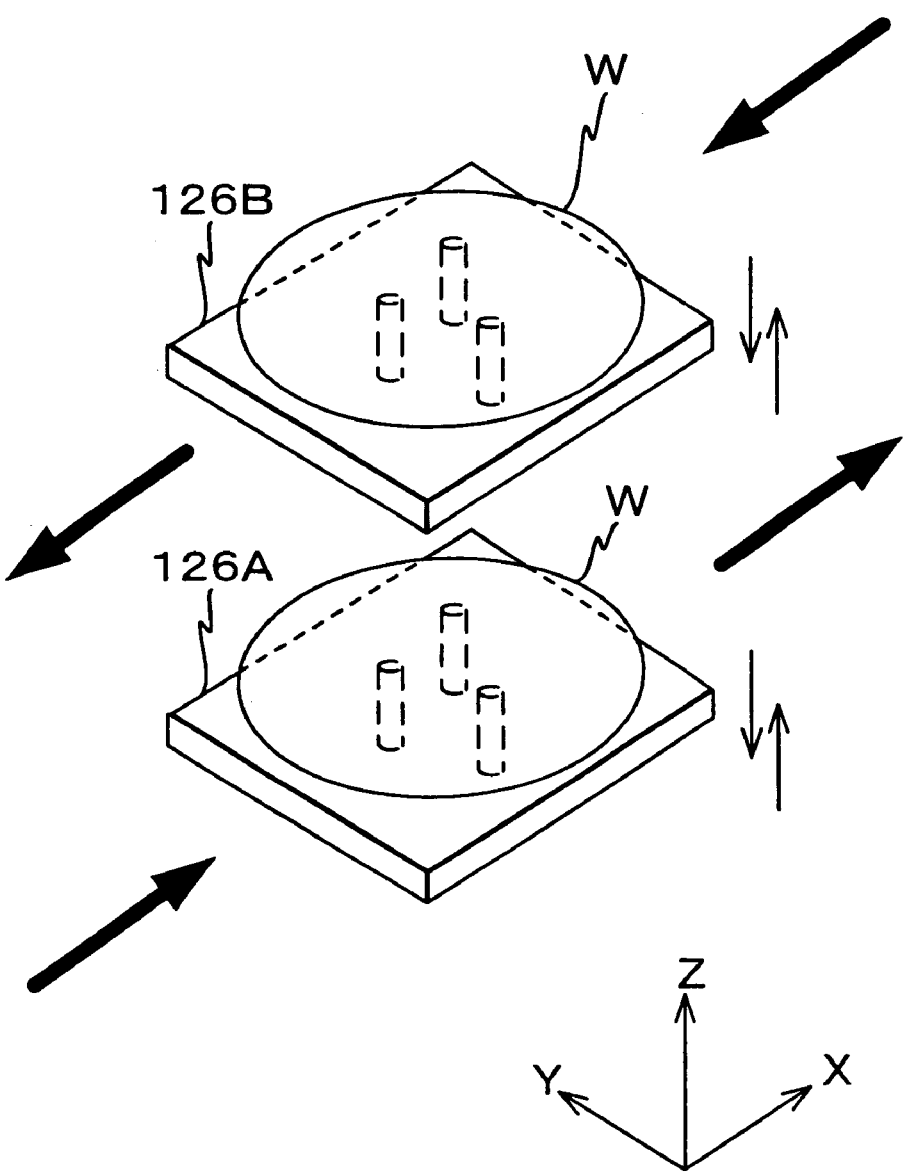
FIG. 3 is a diagonal view showing another arrangement example of the in-line delivery portion.

The in-line delivery portion is not limited to the one shown in FIG. 2, and for example may have the structure shown in FIG. 3. With this arrangement, the load side of the in-line delivery portion may have a wafer delivery portion 126A and the unload side may have a wafer delivery portion 126B that are vertically arranged at a predetermined interval, and are driven interlocked in the vertical direction. The wafer delivery portions 126A and 126B each have a plate shaped member, and a set of three supporting pins fixed on the upper surface of the plate shaped member.

Referring back to FIG. 1, within the chamber 112, a carrier mount 118 on which a buffer carrier 120 is placed can be arranged when necessary. The buffer carrier 120 is a temporary housing for the wafer W.

As is shown in FIG. 1, the C/D 50 comprises two chambers, a chamber 52 and a chamber 54 arranged adjacently along the X-axis direction. A Y guide 56, which extends in the Y-axis direction, is arranged within the chamber 52. On the Y guide 56, a horizontal jointed arm robot (a scalar robot) 58 that moves along the Y guide 56 driven by a driving unit (not shown in Figs.) is arranged.

In addition, within the chamber 52 on the −X side of the Y guide, carrier mounts 60A, 60B, and 60C are arranged along the Y-axis direction. On these carrier mounts 60A, 60B, and 60C, OCs 24C, 24D, and 24E are respectively arranged. The OCs 24C, 24D, and 24E are delivered to/from the chamber 52 through an entrance (not shown in Figs) arranged on the side wall in the −X side of the chamber 52 which has a door (also not shown in Figs) that can be opened/closed. The OCs 24C, 24D, and 24E may be carried by a PGV (Personnel Guided Vehicle) and delivered manually by an operator, or may be carried by an AGV (Automated Guided Vehicle) and automatically delivered. The OHT (Over Head Transfer) may naturally be employed to respectively place the OCs 24C, 24D, and 24E onto the carrier mounts 60A, 60B, and 60C from above.

Besides the arrangement above, within the chamber 52, a coating/development controller 62 is arranged which performs overall control of each portion structuring the C/D 50. Other than controlling the carriage system of the wafer within the C/D 50 and the like, the coating/development controller 62 also controls the scalar robot 116 and the like of in the in-line I/F portion 110. The coating/development controller 62 also communicates (other than the realtime information on the delivery of the wafer, information to decide the next operation that contributes to improving the processing capacity (throughput) related to the wafer carriage is communicated (details will be described later), that is, transmits and receives information) with the loader controller 34 of the exposure apparatus 10.

On the interface of the chamber 52 and the chamber 54, a substrate delivery portion 64 is arranged slightly on the −Y side of the center in the Y-axis direction. The substrate delivery portion 64 is made up of a base mount, and a set of three supporting pins fixed on the base mount.

Within the chamber 54, an X guide 66 extending in the X-axis direction, is arranged on the +X side of the substrate delivery portion 64. On the X guide 66, a horizontal jointed arm robot (a scalar robot) 68 that moves along the X guide 66 driven by a driving unit (not shown in Figs.) is arranged.

In addition, within the chamber 54, a first development portion 70, a second development portion 72, and a bake portion 74 are arranged sequentially from the left as is shown in FIG. 1 on the +Y side of the X guide 66. Also, on the −Y side of the X guide 66, a first coating portion 76, a second coating portion 78, and a cooling portion 80 are arranged, respectively facing the first development portion 70, the second development portion 72, and the bake portion 74.

The first coating portion 76 and the second coating portion 78 each have a spin coater. The spin coater forms a resist film with uniform thickness on the wafer by dripping a drop of the resist on the wafer, which is arranged horizontally, and making it rotate. The spin coater is structured of a combination of a resist supply system, a spin motor, and a cup, and is capable of rotating up to several thousand times per minute.

The bake portion 74 comprises a baking unit. The baking unit can employ methods such as the resistance heating method or the infrared heating method. In this case, the baking unit performs pre-bake (PB) and pre-development bake (post-exposure bake: PEB). Pre-bake is a heat treatment conducted after the resist is coated onto the wafer to vaporize the residual solvent in the coated film and to strengthen the contact between the coated film and the wafer. Since the treatment is performed before exposure, it is to be performed at the temperature where the polymer does not polymerize or additives do not pyrolyze. In addition, the pre-development bake is a heat treatment that is conducted after exposure before the development process is performed. This treatment is performed in order to reduce deformation in the resist pattern (resist side wall shape) due to the standing wave effect caused in the case of exposure with light having a single wavelength, and also for the purpose of driving catalytic reactions in a chemically amplified resist after exposure.

The cooling portion 80 comprises, for example, a cooled flat plate, which is called a cooling plate. This plate is cooled, for example, with the circulation of cooling water. Or, the plate can be electronically cooled due to the Peltier effect. With the embodiment, the wafer, which is heated upon PB, is cooled until it does not have any serious effect to the operation of the exposure apparatus 10.

The first development portion 70 and the second development portion 72 comprise development units to develop the wafer on which the pattern image is formed on the resist on exposure by the exposure apparatus 10. The development unit used can be any of the spin type, the dip type, or the spray type.

Furthermore, on the interface of the chamber 54 and the chamber 112, located on the +X side of the X-guide 66, a substrate delivery portion 82 is arranged. The substrate delivery portion 82 is made up of a base mount, and a set of three supporting pins fixed on the base mount.

Figure 4:
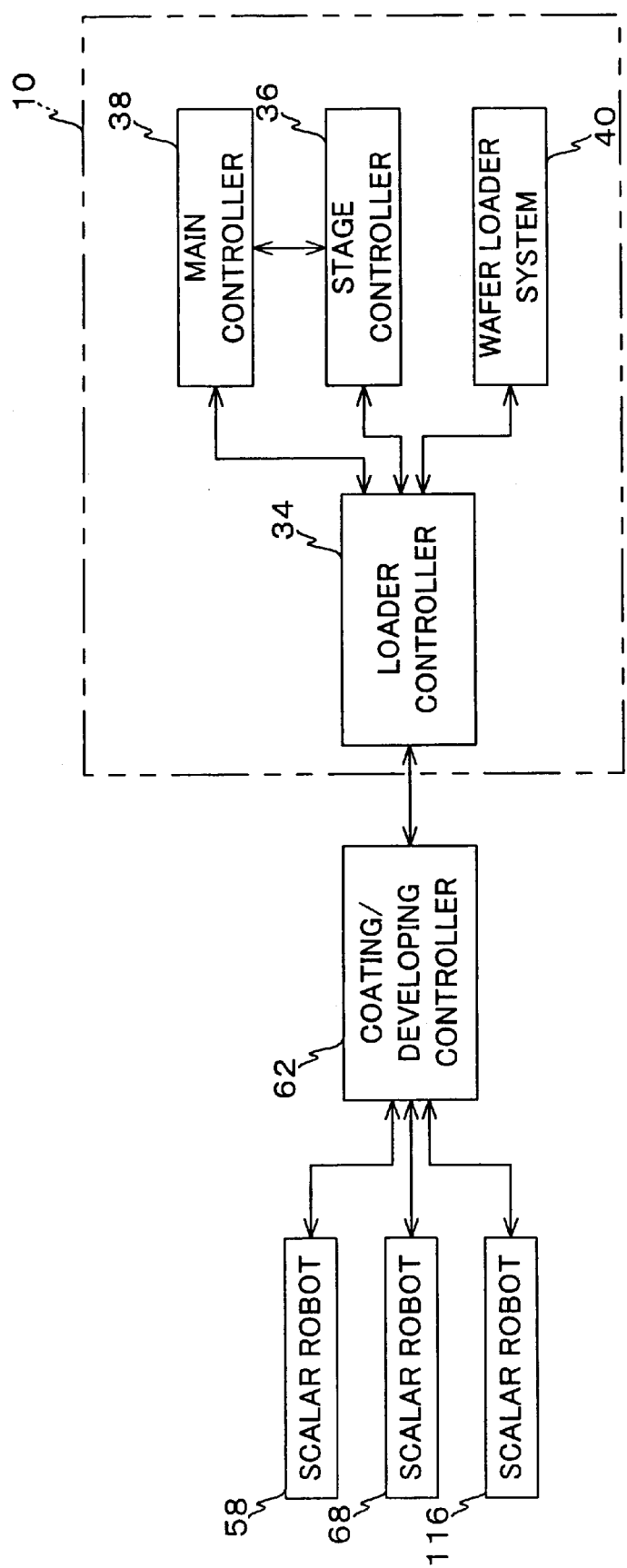
FIG. 4 is a block diagram schematically showing an arrangement of the control system related to wafer carriage in the lithographic system in FIG. 1.

FIG. 4 shows the arrangement of the control system of the lithographic system 100 in a block diagram. As is shown in FIG. 4, other than the loader controller 34, the control system of the exposure apparatus 10 comprises a stage controller 36 to control the wafer stage WST, the reticle stage (not shown in Figs.), and the like. The control system also comprises a main controller 38 that performs overall control over the whole apparatus via the loader controller 34, the stage controller 36, and the like.

On the other hand, the control system of the C/D 50 is structured with the coating/development controller 62 playing the main role. The coating/development controller 62 controls the scalar robots 58, 68, 116, and the like. In addition, in the embodiment, the substrate carriage system of the C/D side is structured with the scalar robots 58, 68, and 116, the X guide 66, and the Y guide 56, and the like.

The wafer processing operation by the lithographic system 100 will be described next.

As a premise, the wafer W serving as a substrate is in a unit (for example, 25 slices) per lot, and the lots are respectively housed in the OCs 24A to 24E. These OC 24A, 24B, 24C, 24D, and 24E are respectively placed on the carrier mounts 22A, 22B, 60A, 60B, and 60C. The OCs 24A and 24B may be used as a buffer within the exposure apparatus, likewise with the buffer carrier 120.

As an example, the case of processing the wafer(s) W housed in the OC 24D will be described. The following operation of each portion will be performed by the coating/development controller 62, the loader controller 34 under the control of the main controller 38, and the stage controller 36, which are shown in FIG. 4. However, for the sake of simplicity in the following description, unless it is required, accounts on these controllers are omitted.

First, the scalar robot 58 takes out the first wafer (referred to as $W_1$) from the OC 24D, and mounts it on the substrate delivery portion 64. During this operation, the scalar robot 68 is to be on the left edge position in FIG. 1. Then, the scalar robot 68 takes the wafer $W_1$, from the substrate delivery portion 64, and loads it, for example, into first coating portion 76. Upon loading, the spin coater within the first coating portion starts the resist coating, which was referred to earlier in the description.

In parallel with the operation of the scalar robot 68, the scalar robot 58 takes out the second wafer (referred to as $W_2$) from the OC 24D, and mounts it on the substrate delivery portion 64. The scalar robot 68 then takes the wafer $W_2$ from the substrate delivery portion 64 and loads it into the second coating portion 78. And when the resist coating of the wafer $W_1$ is completed, the scalar robot 68 takes the wafer $W_1$ out from the first coating portion 76 and loads it into he bake portion 74. With this operation, the baking unit in the bake portion 74 starts the heat treatment (PB) of the wafer $W_1$.

While the wafer $W_1$ is being loaded into the bake portion, the scalar robot 58 takes out the third wafer (referred to as $W_3$) from the OC 24D, and mounts it on the substrate delivery portion 64. Then, the scalar robot 68 takes the wafer $W_3$ from the substrate delivery portion 64, and loads it into the first coating portion 76.

And when the PB of the wafer $W_1$ is completed, the scalar robot 68 takes out the wafer $W_1$ from the bake portion 74 and loads it into the cooling portion 80. With this operation, the cooling operation of the wafer $W_1$ begins in the cooling portion 80. The target temperature of this cooling operation is set at a temperature that does not seriously effect the operation of the exposure apparatus 10. It is usually the same as the target temperature of the air conditioning system in the exposure chamber 12A of the exposure apparatus 10, which is set, for example, within the range of 20 to 25° C. With the recent exposure apparatus, since a pattern having a fine line width is formed and transferred onto a wafer, temperature control has become an important item. This is because even a subtle change in temperature causes expansion/contraction of the wafer and results in various adverse effects such as abnormal line width and overlay defects. The target temperature upon cooling operation may be determined, however, in consideration of temperature change in the wafer when it is carried to the wafer stage WST of the exposure apparatus, after the cooling is completed.

Next, the scalar robot 68 takes out the wafer $W_2$ from the second coating portion 78, on which the resist has been coated. The scalar robot then loads the wafer $W_2$ into the bake portion 80, and then takes the fourth wafer (referred to as $W_4$) that has already been placed on the substrate delivery portion 64 by the scalar robot 58 and loads it into the second coating portion 78.

When the cooling of the wafer $W_1$ is completed in the cooling portion 80, the scalar robot 68 places the wafer $W_1$ onto the substrate delivery portion 82. Next, the scalar robot 68 takes the wafer $W_2$ out of the bake portion 74 after the PB of the wafer $W_2$ is completed, and loads it into the cooling portion 80. The scalar robot 68 then takes out the wafer $W_3$, on which the resist has been coated, from the first coating portion 76, and loads it into the bake portion 74. After completing this loading, the scalar robot 68 takes the fifth wafer (referred to as $W_5$) that has already been placed on the substrate delivery portion 64 by the scalar robot 58, and loads it into the first coating portion 76. Hereinafter, within the C/D 50, the series of operations to the wafers such as the resist coating, the PB, and the cooling likewise as above, are sequentially repeated with the wafer carriage operation, and the wafer(s) W are sequentially mounted on the substrate delivery portion 82.

In the in-line I/F portion 110, the scalar robot 116 sequentially takes the wafer(s) W, which are sequentially mounted on the substrate delivery portion 82 and have not yet been exposed from the substrate delivery portion 82, and passes the wafer(s) onto the load side wafer delivery portion of the in-line delivery portion 114. For example, the wafer(s) W are sequentially placed on the wafer delivery portion 124A.

After a predetermined period of time has elapsed, when the exposure on the first wafer $W_1$ has been completed by the exposure apparatus 10 and the wafer $W_1$ has been carried to the wafer delivery portion 124B by the scalar robot 26, the scalar robot 116 repeatedly performs the operation under a predetermined procedure of taking the wafer(s) W that have not yet been exposed from the substrate delivery portion 82, and carrying and mounting the wafer(s) W onto the wafer delivery portion 124A, as well as the operation of taking the wafer(s) W that have been exposed from the wafer delivery portion 124B, and carrying and mounting the wafer(s) W onto the substrate delivery portion 82.

As is described previously, the wafer $W_1$ that has been exposed and taken from the wafer delivery portion 124B by the scalar robot 116 of the in-line I/F portion 110 and carried and mounted onto the substrate delivery portion 82, is loaded into the bake portion 74 by the scalar robot 68, and the baking unit in the bake portion 74 performs the PEB. The bake portion 74 can house a plurality of wafers at the same time.

And when the PEB on the wafer $W_1$ is completed, the scalar robot 68 takes it out of the bake portion 74, and loads the wafer $W_1$, for example, into the first development portion 70, and the development unit within the first development portion 70 begins the development operation.

While the development is being performed, in the case the wafer $W_2$ has been exposed and is mounted on the substrate delivery portion 82, the scalar robot takes the wafer $W_2$ from the substrate delivery portion 82 and loads it into the bake portion 74. With this operation, the baking unit in the bake portion 74 starts the PEB on the wafer $W_2$. Then, the scalar robot 68 performs operations such as mounting the next wafer W onto the substrate delivery portion 82 or loading the wafer $W_2$ that has completed the PEB into the second development portion 72, under a predetermined procedure.

And when the development of the wafer $W_1$ has been completed, the scalar robot 68 takes the wafer $W_1$ out of the first development portion 70, and mounts it on the substrate delivery portion 64. And finally, the scalar robot 58 takes the wafer $W_1$ and loads it into the predetermined housing shelf within the OC 24D. After this operation, the PEB process, the development process, and the carriage of the wafer are repeatedly performed on the second wafer and onward within the C/D 50, likewise with the procedure of the wafer $W_1$.

To summarize the description so far, until the exposure on the first wafer has been completed, the operation of taking out the wafer from the OC 24D, resist coating, PB, cooling, and carriage of the wafer with these operations are repeatedly performed in a predetermined procedure and sequence by each portion structuring the C/D 50 under the control of the coating/development controller 62 and by the scalar robot 116 of the in-line I/F portion 110 and the like. Thus, the wafer(s) that has not yet been exposed are sequentially mounted on the wafer delivery portion 124A. In addition, immediately after the exposure on the first wafer is completed, the operation of PEB on the wafer, wafer development, loading of the wafer into the OC 24D, and the carriage of the wafer with these operations are repeatedly performed in a predetermined procedure and sequence, along with the operation of taking out the wafer from the OC 24D, resist coating, PB, cooling, and carriage of the wafer with these operations.

Meanwhile, with the exposure apparatus 10, first of all, the scalar robot 26 moves along the X guide 18 to the left end position, and receives the wafer $W_1$ from the in-line delivery portion 114 via the opening of the chamber 16. The scalar robot 26 then moves right, along the X guide 18, until it is positioned in front of the turntable 32 and mounts the wafer $W_1$ on the turntable 32. Immediately after mounting the wafer, the scalar robot 26 moves along the X guide 18 to the left end position to receive the next wafer $W_2$ The turntable 32 is then rotated by a driving system (not shown in Figs.), and the wafer $W_1$ held on the turntable 32 is also rotated. While the wafer $W_1$ is rotated, the wafer edge sensor detects the wafer edge, and based on the detection signals the loader controller 34 obtains information on the direction of the notch on the wafer $W_1$ and the deviation amount (direction and amount) between the center of the wafer and the center of the turntable 32. And the loader controller 34 rotates the turntable 32 so that the notch portion of the wafer W is set at a predetermined direction.

At this stage, the load arm 28 is set at a predetermined wafer delivery position, and receives the wafer $W_1$ held on the turntable 32. Before the load arm 28 receives the wafer, it moves to a position where it can correct the Y direction component of the deviation amount between the center of the wafer and the center of the turntable 32, which was obtained earlier. Then, the load arm 28 receives the wafer and starts to move along the Y guide 20 towards the position above the wafer stage WST, which waits at a predetermined loading position.

At this point, the scalar robot 26 has already received the wafer $W_2$, which has been mounted on the wafer delivery portion 124A of the in-line delivery portion 114 by the scalar robot 116. Therefore, when the load arm 28 has moved away from the X guide 18 for more than a fixed distance, the scalar robot 26 moves right, along the X guide 18, until it comes in front of the turntable 32, and mounts the wafer $W_2$ onto the turntable 32. After mounting the wafer, the scalar robot 26 moves to a predetermined waiting position, while the turntable begins rotation and the wafer edge sensor starts detection of the wafer edge. Then, the loader controller 34 obtains information on the direction of the notch on the wafer $W_2$ and the deviation amount (direction and amount) between the center of the wafer and the center of the turntable 32.

When the load arm 28 finishes carrying the wafer $W_1$ to the position above the wafer stage WST, it delivers the wafer to the wafer stage WST. In, this case, immediately before the wafer $W_1$ is delivered to the wafer stage WST, the wafer stage WST is finely driven in the X-axis direction so as to correct the X component of the deviation amount described above.

Then, exposure operation on the wafer $W_1$ delivered to the wafer stage WST is performed. This exposure is performed, for example, by repeating the operation of setting the position of each shot area of the wafer $W_1$ on the wafer stage WST to the projection position of the reticle pattern held on the reticle stage (not shown in Figs.) by the projection optical system PL (refer to FIG. 1) and the operation of transferring the reticle pattern onto each shot area via the projection optical system PL by illuminating the reticle with the illumination light for exposure.

Naturally, in the case of performing exposure based on the scanning exposure method, exposure is performed by repeating the operation of respectively positioning the reticle (reticle stage) and the wafer $W_1$ (wafer stage WST) at the scanning starting position to expose each shot area and the operation of scanning exposure to sequentially transfer the reticle pattern on to the wafer $W_1$ via the projection optical system PL by illuminating the slit-shaped illumination area on the reticle with the illumination light for exposure, while synchronously moving the reticle and the wafer $W_1$.

When the exposure above is completed, the wafer stage WST moves to the unloading position, that is, to the loading position referred to earlier, and the unload arm 30 receives the wafer $W_1$ that has already been exposed. The unload arm 30 then carries the wafer $W_1$ until it is positioned above the X guide 18, and delivers the wafer to the scalar robot 26, which is waiting to receive the wafer. The scalar robot 26 then carries the wafer $W_1$, and finally delivers it to the unload side wafer delivery portion 124B of the in-line delivery portion 114.

In this case, when the scalar robot 26 moves to a position on the side of the in-line delivery portion 114 where it does not interfere, the load arm 28 receives the wafer $W_2$ that has completed the rotational adjustment from the turntable 32, carries the wafer to the position above the wafer stage WST, which is waiting at the loading position, and delivers the wafer onto the wafer stage WST.

Then, exposure is performed on the wafer $W_2$ delivered onto the wafer stage WST. And after this operation, within the exposure apparatus 10, the operation of sequentially taking the wafer mounted on the wafer delivery portion 124A from the third wafer (referred to as $W_3$) onward, carrying the wafer(s) so as to position the wafer(s) above the wafer stage WST, and after the exposure is completed, delivering the exposed wafer(s) to the unload side wafer delivery portion 124B of the in-line delivery portion 114, are repeatedly performed.

As is described above, with the lithographic system in the embodiment, circulation operation of the wafer(s) W is performed respectively within the C/D 50 and the in-line I/F portion 110 side, and the exposure apparatus 10. And in order to prevent unnecessary waiting time (loss of time) or delivery failure from occurring upon delivering the wafer W between both parties, the coating/development controller 62 of the C/D 50 side communicates as follows with the loader controller 34 of the exposure apparatus 10, via the communication channel (refer to FIG. 4).

That is, the loader controller 34 sends information to the coating/development controller 62, such as items a. to d. referred to below, so that the next operation that contributes to improving the processing capacity (throughput) can be decided in relation to the wafer carriage, before the C/D 50 and the in-line I/F portion 110 side (hereinafter referred to as the "C/D side" for the sake of convenience) goes onto the next operation.

a. Information on the predicted time (or the expected time) until the wafer loader system of the exposure apparatus 10 can receive the wafer W.

b. Information for the C/D side to withhold the wafer carriage to the in-line delivery portion 114, such as, "Wait for xx seconds until the wafer loader system of the exposure apparatus 10 can receive the wafer".

c. Information on the predicted time (or the expected time) until the wafer loader system of the exposure apparatus 10 can send out the wafer W.

d. Information for the C/D side to withhold the wafer receipt at the in-line delivery portion 114, such as, "Wait for xx seconds so that the wafer can be delivered".

The "expected time" referred to in items a. and c. above, here, theoretically means time obtained (by calculation), meaning the time that can be obtained by calculation based on, for example, the angle of view, the exposure amount (with the scanning type exposure apparatus, the angle of view corresponds to the scan length and the exposure amount includes the scan velocity and the like as factors), the alignment period, and the like. In addition, the "predicted time" means time that takes into account the result of the performance or the state of the performance in process, for example, time that has taken into account the information such as "this lot requires a long re-try time upon carriage". More particularly, the predicted time differs from the expected time that can be obtained by calculation, and includes uncertainty factors. For example, in the case the alignment marks are difficult to find during alignment, the actual alignment time may take more than the calculated time. Therefore, it is necessary to obtain the re-try time based on the actual results from wafer circulation carriage actually performed. Factors that may affect the re-try time are, for example, in the case of the carriage system, the time required for vacuum chucking in each carriage arm.

In addition, phenomena such as the alignment time taking more than calculated or the re-try frequently occurring in alignment tend to occur in a specific lot, that is, concentrate on wafers under a specific process. Accordingly, for example, if the actual processing time takes longer than the calculated time with the first few slices of wafers in the lot, the predicted time is re-set longer in correspondence with the results, and is communicated to the other unit (in this embodiment, the C/D or the exposure apparatus). The predicted time, however, may be set, not only by the first few slices of wafers in the lot, but may be set by the average processing time of the wafers processed in one day, or by the average of the processing time of a plurality of lots.

On the other hand, the coating/development controller 62 sends information to the loader controller 34, such as items e. to h. referred to below, so that the next operation that contributes to improving the processing capacity (throughput) can be decided in relation to the wafer carriage, before the exposure apparatus 10 goes onto its next operation.

e. Information on the predicted time (or the expected time) until the C/D side can receive the wafer W.

f. Information for the C/D side to withhold the wafer carriage to the in-line delivery portion 114, such as, "Wait for xx seconds until the C/D side can receive the wafer".

g. Information on the predicted time (or the expected time) until the C/D side can send out the wafer W.

h. Information for the C/D side to withhold the wafer receipt at the in-line delivery portion 114, such as, "Wait for xx seconds so that the wafer can be delivered".

Accordingly, with the lithographic system 100 of the embodiment, the loader controller 34 sends out information to the coating/development controller 62 prior to its next operation for the coating/development controller 62 to decide the next operation that contributes to improving the processing capacity (throughput) in relation to the wafer carriage. And the coating/development controller 62, which receives the information, can decide to perform a specific operation that contributes to the improvement in processing capacity related to the carriage of the wafer W as the next operation, and then actually start the specific operation.

More particularly, the coating/development controller 62 can learn of the timing when the exposure apparatus 10 can receive the wafer W based on the information referred to in item a. referred to above. Therefore, the coating/development controller 62 can decide its next operation related to wafer carriage so that the wafer W can be delivered without any waste of time. To be more concrete, for example, when the coating/development controller 62 delivers the wafer W to the exposure apparatus 10, in the case when the waiting time is short, like one or two seconds, until the exposure apparatus 10 can receive the wafer 10, then the coating/development controller 62 waits and delivers the wafer W to the exposure apparatus 10 via the wafer delivery portion 124A of the in-line delivery portion. However, in the case the coating/development controller 62 has to wait a long time, then the coating/development controller 62 can suspend the carriage operation of delivering the wafer W to the exposure apparatus 10 or if necessary, temporarily house the wafer W into the buffer carrier 120, and perform only the receiving operation of the wafer W from the wafer delivery portion 124B of the in-line delivery portion 114. With this arrangement, the loss of time can be reduced.

In addition, with the coating/development controller 62, for example, based on the information referred to in item b., it can decide its operation related to efficient wafer carriage depending on the waiting time, so that the time wasted is reduced to the minimum.

Also, with the coating/development controller 62, for example, based on the information referred to in item c., when the coating/development controller 62 instructs the receipt of the wafer W, if the wafer that has been exposed is going to be delivered from the exposure apparatus 10 within several seconds, then the coating/development controller 62 can decide to receive the wafer after waiting for a several seconds. With this arrangement, the delivery does not end in vain, thus the efficiency is improved.

And, the coating/development controller 62, for example, can decide its operation related to the most effective wafer carriage possible, based on the information referred to in item d. depending on the waiting time.

In addition, with the lithographic system 100 in the embodiment, information to decide the next operation that contributes to improving the processing capacity related to the carriage of the wafer W is sent out to the loader controller 34 of the exposure apparatus 10 via the communication channel from the coating/development controller 62 prior to the next operation. When the loader controller 34 receives the information, it can decide to perform the specific operation that contributes to improving the processing capacity related to the carriage of the wafer W as its next operation, before actually starting the specific operation.

That is, the loader controller 34 of the exposure apparatus 10 can decide its next operation related to the carriage of the wafer W based on the information e. to h. referred to above, likewise with the coating/development controller 62 that has received the information a. to d. With this operation, the wafer carriage state of the C/D side does not have to be monitored and the circulation operation of the wafer carriage switched at a constant interval, therefore, the loss of time can be reduced.

As can be seen from the explanation so far, in the embodiment, the loader controller 34 structures the control unit of the exposure apparatus side, and the coating/development controller 62 structures the control unit of the C/D side serving as the substrate processing unit. The arrangement, however, is not limited to this, and as the control unit of the exposure apparatus side, a first control unit that has the function of transmitting the information referred to in earlier the items a. to d. to the C/D side and a second control unit that has the function of receiving the information referred to in earlier the items e. to h. from the C/D side may be arranged. The same can be said for the control unit of the C/D side.

As is described in detail so far, in the lithographic system 100 in the embodiment, information related to the carriage of the wafer W is communicated between the exposure apparatus 10 and the C/D side, and both units can reciprocally determine their next operation that contributes to improving the processing capacity related to the carriage of the wafer prior to the operation based on the information provided from the other unit. In other words, both the C/D and the exposure apparatus 10 sides do not complete their operation at an optimum only within their own units, but reciprocally take into consideration the information related to the wafer carriage of the other unit so that the circular operation is in line with each other. This prevents the loss of time and failure in delivery from occurring, and allows the throughput to be improved, even though the exposure apparatus 10 and the C/D50 are in-line connected. Thus, throughput in the series of wafer processing performed by the C/D50 and the exposure apparatus 10 can be improved, and as a consequence, it becomes possible to improve the productivity of the device such as a semiconductor device.

In the case, however, when the information to withhold carriage, such as the items b., d., f., and h. described earlier, is sent at the same time by both the controllers 34 and 62, the situation may occur when the carriage conditions are not satisfied on both sides. In such a case, preference may be given to either of the unit in advance, and the unit to which the preference is given may send information to the other unit to dismiss the request from the other unit. The other control unit then may acknowledge that its request has been dismissed, and based on the information, withdraw the withholding request and go on to the next process.

In addition, in the embodiment, when the C/D50 has a plurality of processing portions of each process such as the resist coating process and the development process within its unit and can switch the order of the circulation carriage in an optimum so that the carriage is performed sequentially in the order of the wafer that has been processed when necessary, it is possible to fully demonstrate the function.

In the embodiment above, the case has been described when the coating/development controller 62 of the C/D side and the loader controller 34 of the exposure apparatus 10 reciprocally send information to decide the next operation that contributes to improving the processing capacity related to the carriage of the wafer W, however, the present invention is not limited to this. That is, either of the coating/development controller 62 of the C/D side or the loader controller 34 of the exposure apparatus 10 may send information to decide the next operation that contributes to improving the processing capacity related to the carriage of the wafer W to the other unit. Even in such a case, the control unit which receives the information can determine and proceed with the carriage operation of the wafer W so that the loss of time and failure in delivery does not occur to the utmost within its unit as is described earlier. Thus, it is possible to improve the throughput in the series of wafer processing performed by the C/D 50 and the exposure apparatus 10 can be improved.

In the embodiment above, the exposure apparatus 10 (the loader controller 34) and the C/D 50 (the coating/development controller 62) communicates the information through a communication channel. As this communication channel, in addition to wired channels such as the parallel channel or the serial channel, radio, infrared, or other channels may be used. Also, for example, in the case of performing parallel communication, an empty line in an existing signal cable may be used. In the case of performing serial communication, the information above can be added to the signals (or information) that have been communicated.

In the embodiment above, the case has been described when the C/D 50 serving as the substrate processing unit and the exposure apparatus 10 are in-line connected via the in-line I/F portion 110. The present invention, however, is not limited to this, and the substrate processing unit and the exposure apparatus may be directly connected. In addition, the arrangement of the substrate processing unit and the exposure apparatus in the embodiment above, are mere examples. That is, in the embodiment above, the case has been described when as the wafer loader system 40 in the exposure apparatus 10, the carriage system of the load side and the unload side use the system partially in common. However, the carriage system of the load side and unload side may be structured of a completely independent system. In this case, it becomes possible to perform loading and unloading of the wafers at the same time in parallel within the exposure apparatus. In this case as well, in the present invention, since the scheduled time of the loading and unloading of the substrate by the substrate processing unit side is expected, if it takes time for loading, then the exposure process and unloading can have priority over the loading, whereas, if it takes time for unloading, the loading may be performed at an extent so that the substrates are not left unfinished in the exposure apparatus, which consequently leads to an efficient operation.

In addition, in the embodiment above, the case has been described when three scalar robots 58, 68, and 116 are arranged in the C/D side, however, the present invention is not limited to this, and a single robot may circulate the wafers while moving along a predetermined route. Furthermore, two sets of scalar robots 68 may be arranged so that they can be used separately in the pre-exposure process and post-exposure process. Also, the scalar robots 58, 68, and 116 that make up the wafer carriage system perform these circulation operations under the procedures set in advance. The scalar robots, however, may each perform the circulation operation on their own, so as to perform a series of circulation operations as a whole. In addition, a quite common unit structure was indicated as an example for the internal arrangement of the C/D 50, however, the processing in the C/D does not have to be performed in the order described earlier in the embodiment, and may include a process which was not mentioned in this description.

Also, each processing portion such as the resist coating portion, the development portion, the cooling portion, and the bake portion may be arranged in plurals if necessary, and the carriage system of the substrate may perform necessary carriage operations according to the arrangement. In addition, the substrate processing unit is not limited to the C/D, therefore, if the unit is in-line connectable to the exposure apparatus, then not only the resist coating unit (coater), the development unit (developer), but also other testing units may be used.

In addition, in the embodiment above, the case has been described when the OC is used as the wafer carrier. The present invention, however, is not limited to this, and the open/close type wafer carrier such as the Front Opening Unified Pod (FOUP) may be used.

Also, in the embodiment above, the coating/development controller 62 and the loader controller 34 transmit and receive realtime information on wafer delivery via the communication channel, as well as information referred to in items a. to h. The present invention, however, is not limited to this. That is, as is shown in FIG. 5, in the case the coating/development controller 62 and the loader controller 34 are connected to the exposure apparatus 10 and the host computer 90, which has control over the C/D 50, via the communication channel, the information transmitted and received in between the coating/development controller 62 and the loader controller 34 may only be on realtime information on wafer delivery, and information referred to in items a. to h. may be communicated through the host computer 90.

Figure 5:
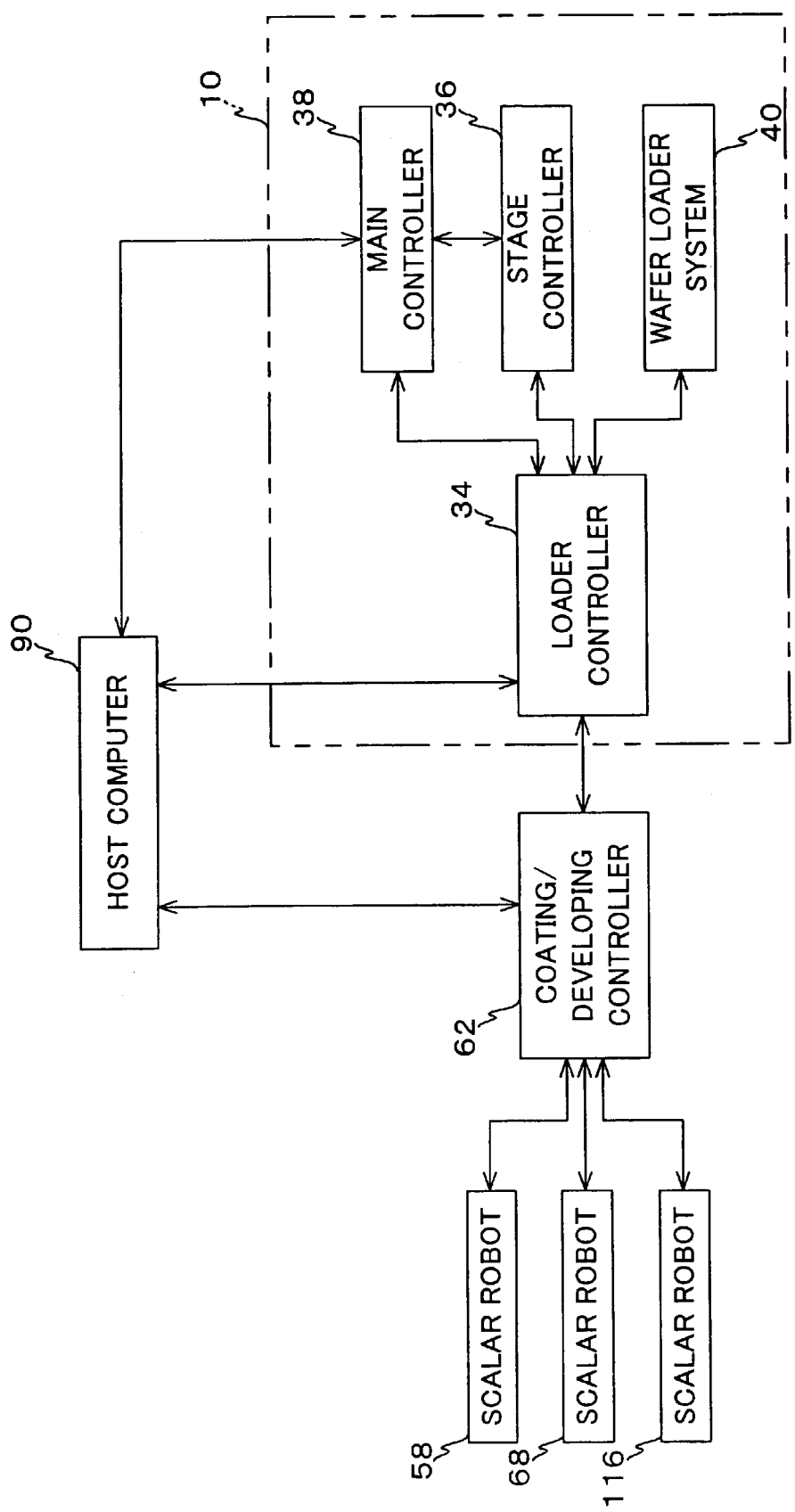
FIG. 5 is a block diagram showing an arrangement of a control system related to wafer carriage in the lithographic system in a modified example.

In the case of the system arrangement shown in FIG. 5, preference is not given to either of the control units 62 and 34 as is referred to earlier. And, when the withholding request information is sent from both control units 62 and 34 at the same time and clashes, the host computer 90 may totally judge from the viewpoint of improving the processing capacity to send information to the predetermined unit that its request has been dismissed, while instructing the other unit to withdraw the withholding request.

When an intermediate control unit is provided in between the host computer 90, and the exposure apparatus 10 and the C/D 50, the information referred to in items a. to h. may be communicated through not only the host computer, but also the intermediate control unit. And when the withholding request information is sent from both control units 62 and 34 at the same time and clashes, the intermediate control unit may totally judge from the viewpoint of improving the processing capacity to send information to the predetermined unit that its request has been dismissed, while instructing the other unit to withdraw the withholding request.

The embodiment above describes the case of an exposure apparatus having a single wafer stage, however, the present invention is not limited to this, and can be suitably applied to an exposure apparatus that has a twin stage (a double stage) where the wafer loading position is set at two places. In addition, the expected time, or the predicted time described earlier, may be obtained for each predetermined slices of wafers, based on the illumination conditions or the reticle type and the like.

Device Manufacturing Method

A device manufacturing method using the lithographic system related to the embodiment described above in a lithographic process will be described next.

Figure 6:
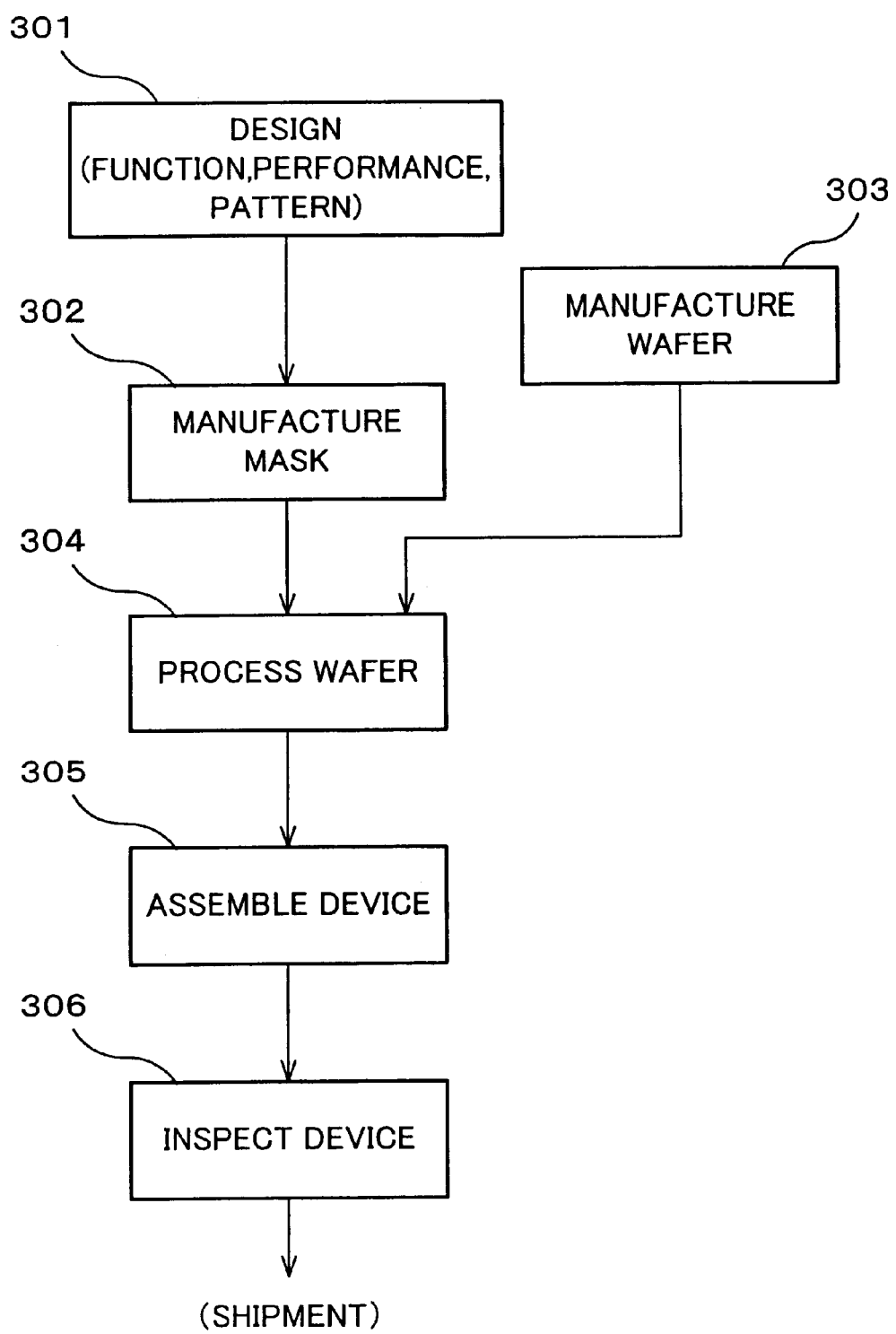
FIG. 6 is a flow chart for explaining an embodiment of a device manufacturing method according to the present invention.

FIG. 6 is a flowchart showing an example of manufacturing a device (a semiconductor chip such as an IC or LSI, a liquid crystal panel, a CCD, a thin magnetic head, a micromachine, or the like). As shown in FIG. 6, in step 301 (design step), function/performance is designed for a device (e.g., circuit design for a semiconductor device) and a pattern to implement the function is designed. And, in step 302 (mask manufacturing step), a mask on which the designed circuit pattern is formed is manufactured. Meanwhile, in step 303 (wafer manufacturing step), a wafer is manufactured by using a silicon material or the like.

Next, in step 304 (wafer processing step), an actual circuit and the like is formed on the wafer by lithography or the like using the mask and wafer prepared in steps 301 to 303, as will be described later. And, in step 305 (device assembly step), a device is assembled using the wafer processed in step 304. Step 305 includes processes such as dicing, bonding, and packaging (chip encapsulation).

Finally, in step 306 (inspection step), a test on the operation of the device, durability test, and the like are performed on the device manufactured in step 305. After these steps, the device is completed and shipped out.

Figure 7:
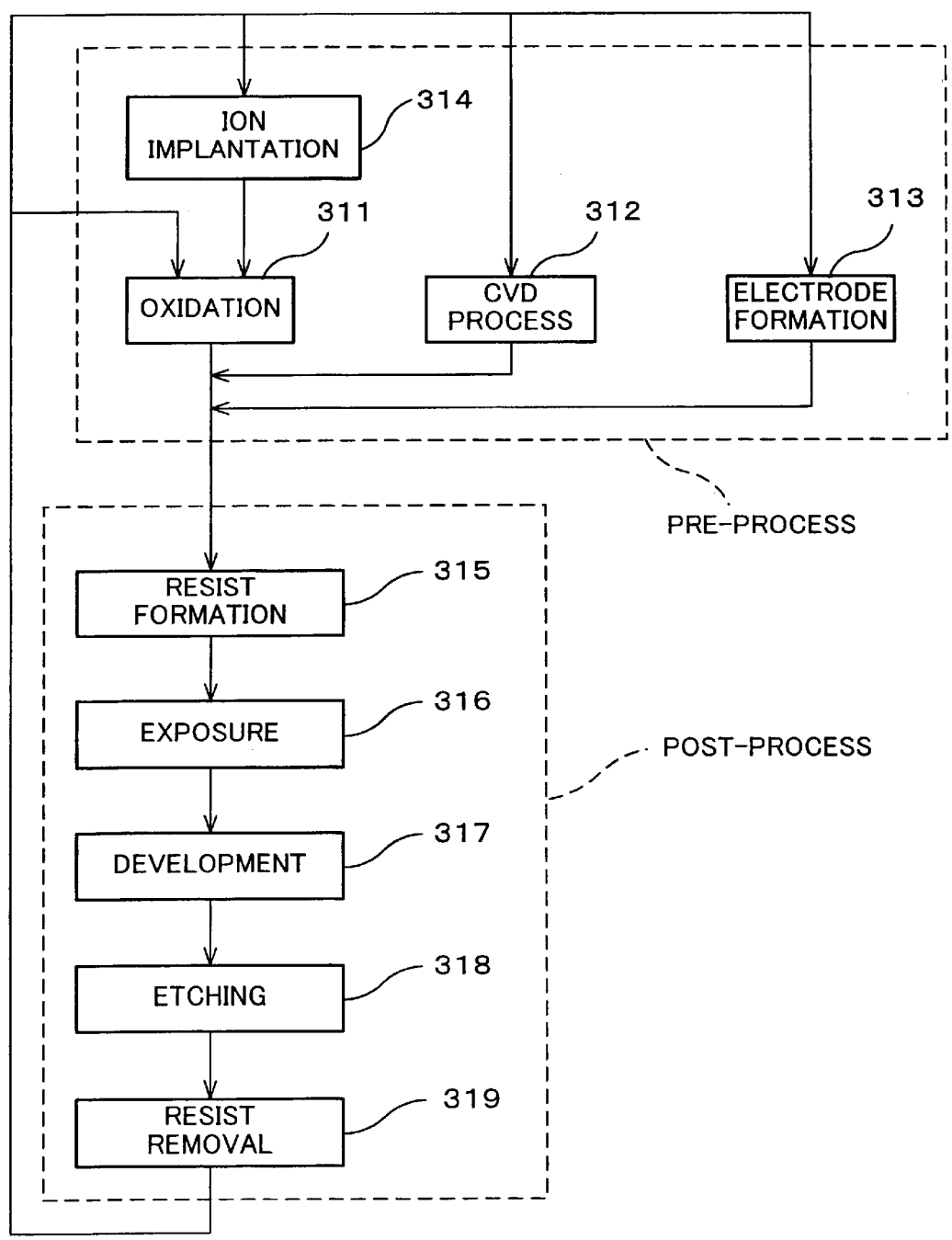
FIG. 7 is a flow chart showing the processing in step 304 in FIG. 6.

FIG. 7 is a flow chart showing a detailed example of step 304 described above in manufacturing the semiconductor device. Referring to FIG. 7, in step 311 (oxidation step), the surface of the wafer is oxidized. In step 312 (CVD step), an insulating film is formed on the wafer surface. In step 313 (electrode formation step), an electrode is formed on the wafer by vapor deposition. In step 314 (ion implantation step), ions are implanted into the wafer. Steps 311 to 314 described above constitute a pre-process for the respective steps in the wafer processing and are selectively executed in accordance with the processing required in the respective steps.

When the above pre-process is completed in the respective steps in the wafer process, a post-process is executed as follows. In this post-process, first, in step 315 (resist formation step), the wafer is coated with a photo sensitive agent. Next, as in step 316 (exposure step), the circuit pattern on the mask is transcribed onto the wafer by the above exposure apparatus and method. Then, in step 317 (developing step), the exposed wafer is developed. The steps 315 to 317, is performed by the lithographic system 100 described in the embodiment above.

Instep 318 (etching step), an exposed member on a portion other than a portion where the resist is left is removed by etching. Finally, in step 319 (resist removing step), the unnecessary resist after the etching is removed.

By repeatedly performing these pre-process and post-process steps, multiple circuit patterns are formed on the wafer.

As described above, according to the device manufacturing method of the embodiment, the lithographic system 100 described in the embodiment above is used in the steps 315 to 317 (lithographic step). And in between the exposure apparatus and the C/D50, information related to wafer carriage is communicated, and both units reciprocally, or either of the unit decides its next operation that contributes to improving the processing capacity related to the wafer carriage before actually starting the operation based on the information from the other unit. Thus, the throughput of the series of wafer processing performed by the C/D50 and the exposure apparatus 10 can be improved, and as a consequence, it becomes possible to improve the productivity of the device. Especially in the case when a vacuum ultraviolet light source such as, for example, the $F_2$ laser light source is used as the light source in the exposure apparatus, with the effect of the improvement in resolution of the projection optical system PL, for example, the productivity can be increased even if the minimum line width is around 0.1 $\mu$m.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A lithographic system, said system comprising:

an exposure apparatus; and a substrate processing unit configured to be in-line connected to said exposure apparatus, wherein said exposure apparatus and said substrate processing unit are configured to perform at least one of:

a. transmitting and receiving information related to one of a predicted time and an expected time until said exposure apparatus is capable of sending out a substrate to said substrate processing unit, b. transmitting and receiving information related to one of a predicted time and an expected time until said exposure apparatus is capable of receiving a substrate from said substrate processing unit, c. transmitting and receiving information related to one of a predicted time and an expected time until said substrate processing unit is capable of sending out a substrate to said exposure apparatus, and d. transmitting and receiving information related to one of a predicted time and an expected time until said substrate processing unit is capable of receiving a substrate from said exposure apparatus.

2. The lithographic system according to claim 1, wherein at least one of said a. to d. is performed prior to starting a following operation relating to carriage of said substrate.

3. The lithographic system according to claim 2, wherein a receiving side performs the following operation based on said at least one of said a. to d.

4. The lithographic system according to claim 3, wherein said receiving side withholds a sending-out operation of a substrate based on said at least one of said a. to d.

5. The lithographic system according to claim 3, wherein said receiving side withholds a receiving operation of a substrate based on said at least one of said a. to d.

6. An exposure apparatus configured to be in-line connected to a substrate processing unit, said exposure apparatus comprising:

a substrate carriage system configured to carry a substrate within said exposure apparatus and to deliver a substrate between said exposure apparatus and said substrate processing unit; and a control unit configured to control said substrate carriage system, said control unit performing at least one of:

a. transmitting information to said substrate processing unit, said information being related to one of a predicted time and an expected time until said exposure apparatus is capable of sending out a substrate to said substrate processing unit, b. transmitting information to said substrate processing unit, said information being related to one of a predicted time and an expected time until said exposure apparatus is capable of receiving a substrate from said substrate processing unit, c. receiving information from said substrate processing unit, said information being related to one of a predicted time and an expected time until said substrate processing unit is capable of sending out a substrate to said exposure apparatus, and d. receiving information from said substrate processing unit, said information being related to one of a predicted time and an expected time until said substrate processing unit is capable of receiving a substrate from said exposure apparatus.

7. The exposure apparatus according to claim 6, wherein said control unit performs at least one of said a. to d. prior to starting a following operation relating to carriage of a substrate.

8. The exposure apparatus according to claim 7, wherein said control unit is configured to transmit decision information to said substrate processing unit, thereby enabling said substrate processing unit to decide a following operation on a substrate processing unit side with respect to a substrate carriage, by performing one of said a. and b. prior to starting a following operation relating to carriage of a substrate.

9. The exposure apparatus according to claim 8, wherein said decision information includes information to make said substrate processing unit withhold a sending-out operation of said substrate.

10. The exposure apparatus according to claim 8, wherein said decision information includes information with which said control unit makes said substrate processing unit withhold a receiving operation of said substrate.

11. A substrate processing unit configured to be in-line connected to an exposure apparatus, said substrate processing unit comprising:
    a substrate carriage system configured to carry a substrate within said substrate processing unit and to deliver a substrate between said substrate processing unit and said exposure apparatus; and
    a control unit configured to control said substrate carriage system, said control unit performing at least one of:
        a. receiving information from said exposure apparatus, said information being related to one of a predicted time and an expected time until said exposure apparatus is capable of sending out a substrate to said substrate processing unit,
        b. receiving information from said exposure apparatus, said information being related to one of a predicted time and an expected time until said exposure apparatus is capable of receiving a substrate from said substrate processing unit,
        c. transmitting information to said exposure apparatus, said information being related to one of a predicted time and an expected time until said substrate processing unit is capable of sending out a substrate to said exposure apparatus, and
        d. transmitting information to said exposure apparatus, said information being related to one of a predicted time and an expected time until said substrate processing unit is capable of receiving a substrate from said exposure apparatus.

12. The substrate processing unit according to claim 11, wherein said control unit performs at least one of said a. to d. prior to starting a following operation relating to carriage of a substrate.

13. The substrate processing unit according to claim 12, wherein said control unit is configured to decide a following operation on a substrate processing unit side with respect to a substrate carriage by performing one of said a. and b. prior to starting the following operation.

14. The substrate processing unit according to claim 13, wherein decision information with which said substrate processing unit decides a following operation on said substrate processing unit side with respect to said substrate carriage includes information with which said control unit withholds a sending-out operation of said substrate.

15. The substrate processing unit according to claim 13, wherein decision information with which said substrate processing unit decides a following operation on said substrate processing unit side with respect to said substrate carriage includes information with which said control unit withholds a receiving operation of said substrate.

16. A method for carrying a substrate between an exposure apparatus and a substrate processing unit configured to be in-line connected to said exposure apparatus, said method including:
    performing, prior to starting an operation relating to carriage of a substrate, at least one of:
        a. transmitting information from said exposure apparatus to said substrate processing unit, said information being related to one of a predicted time and an expected time until said exposure apparatus is capable of sending out a substrate to said substrate processing unit,
        b. transmitting information from said exposure apparatus to said substrate processing unit, said information being related to one of a predicted time and an expected time until said exposure apparatus is capable of receiving a substrate from said substrate processing unit,
        c. transmitting information from said substrate processing unit to said exposure apparatus, said information being related to one of a predicted time and an expected time until said substrate processing unit is capable of sending out a substrate to said exposure apparatus, and
        d. transmitting information from said substrate processing unit to said exposure apparatus, said information being related to one of a predicted time and an expected time until said substrate processing unit is capable of receiving a substrate from said exposure apparatus; and
    performing carriage of a substrate based on a result of performing at least one of said a. to d.

17. The method according to claim 16, wherein a receiving side is configured to decide a following operation based on the results of performing at least one of said a. to d.

18. The method according to claim 17, wherein said substrate processing unit withholds a receiving operation of a substrate based on a result of performing said a.

19. The method according to claim 17, wherein said substrate processing unit withholds a sending-out operation of a substrate based on a result of performing said b.

20. A lithographic system, said system comprising:
    an exposure apparatus; and
    a substrate processing unit configured to be in-line connected to said exposure apparatus, and configured to transmit and receive withholding information between said substrate processing unit and said exposure apparatus to withhold a carriage operation of a substrate,
    wherein when said withholding information is concurrently sent by both said exposure apparatus and said substrate processing unit, one of said exposure apparatus and said substrate processing unit, selected in advance, is configured to send dismissal request information to the other one of said exposure apparatus and said substrate processing unit, thereby instructing the other one of said exposure apparatus and said substrate processing unit to withdraw said withholding information.

21. A lithographic system, said system comprising:
    an exposure apparatus;
    a substrate processing unit configured to be in-line connected to said exposure apparatus and configured to transmit and receive withholding information between said substrate processing unit and said exposure apparatus to withhold a carriage operation of a substrate; and a superior unit configured to exercise control over said exposure apparatus and said substrate processing unit, wherein when said withholding information is concurrently sent by both said exposure apparatus and said substrate processing unit, said superior unit is configured to improve a processing capacity by sending information to either said exposure apparatus or said substrate processing unit to withdraw said withholding information.

22. An exposure apparatus which transfers a predetermined pattern formed on a mask onto a substrate, said exposure apparatus comprising:

a substrate carriage system which carries a substrate within said exposure apparatus and delivers a substrate; and a control unit which controls said substrate carriage system, wherein said control unit transmits at least one of:
(a) information related to one of a predicted time and an expected time until said exposure apparatus is capable of sending out a substrate, and
(b) information related to one of a predicted time and an expected time until said exposure apparatus is capable of receiving a substrate.

23. The exposure apparatus according to claim 22, wherein said control unit transmits at least one of said (a) and (b) prior to starting a following operation relating to carriage of a substrate.

* * * * *